US006891213B1

(12) United States Patent
Noble

(10) Patent No.: US 6,891,213 B1
(45) Date of Patent: *May 10, 2005

(54) BASE CURRENT REVERSAL SRAM MEMORY CELL AND METHOD

(75) Inventor: Wendell P. Noble, Milton, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/626,777

(22) Filed: Jul. 23, 2003

Related U.S. Application Data

(62) Division of application No. 10/284,984, filed on Oct. 30, 2002, now Pat. No. 6,699,742, which is a continuation of application No. 09/757,683, filed on Jan. 8, 2001, now Pat. No. 6,489,192, which is a division of application No. 09/268,823, filed on Mar. 16, 1999, now Pat. No. 6,313,490.

(51) Int. Cl.[7] ............................................. H01L 29/72
(52) U.S. Cl. ...................... 257/296; 257/288; 257/289
(58) Field of Search ............................... 257/288, 289, 257/296

(56) References Cited

U.S. PATENT DOCUMENTS

| | | | |
|---|---|---|---|
| 4,810,667 A | 3/1989 | Zorinsky et al. | 437/62 |
| 4,881,105 A | 11/1989 | Davari et al. | 357/23.4 |
| 5,194,396 A | 3/1993 | Kim et al. | 437/31 |
| 5,574,299 A | 11/1996 | Kim | 257/296 |
| 5,592,005 A | 1/1997 | Floyd et al. | 257/331 |
| 5,594,683 A | 1/1997 | Chen et al. | 365/177 |
| 6,075,272 A | 6/2000 | Forbes et al. | 257/378 |
| 6,229,161 B1 | 5/2001 | Nemati et al. | 257/133 |
| 6,313,490 B1 * | 11/2001 | Noble | 257/288 |
| 6,489,192 B2 | 12/2002 | Noble | 438/202 |

FOREIGN PATENT DOCUMENTS

| | | |
|---|---|---|
| JP | 359232437 A | 12/1984 |
| JP | 10135235 | 5/1998 |

OTHER PUBLICATIONS

S.D. Malaviya, "Single Device DC Stable Memory Cell", IBM Technical Disclosure Bulletin, vol. 20, No. 9, Feb. 1978, IBM Corp. 1978, 3492–3494.

Jack Y.C. Sun, CMOS Technology for 1.8V and Beyond:, Semiconductor Research and Development Center, IBM Corporation, pp. 293–297.

Sakui, Koji et al., "A New Static Memory Cell Based on Reverse Base Current (RBC) Effect of Bipolar Transistor", ULSI Research Center, Toshiba Corporation, Japan, 44–IEDM 88 (4 pages).

Van der Wagt, J.P., et al., "RTD/HFET Low Standby Power SRAM Gain Cell", IEEE Electron Device Letters, vol. 19, No. 1, Jan. 1998, pp. 6–9.

Verdonckt–Vandebroek, Sophie et al., "Hight–Gain Lateral Bipolar Action in a MOSFET Structure", IEEE Transactions on Electron Devices, vol. 38, No. 11, Nov. 1991, pp. 2487–2496.

* cited by examiner

Primary Examiner—Edward Wojciechowicz
(74) Attorney, Agent, or Firm—Dorsey & Whitney LLP

(57) ABSTRACT

A SRAM memory cell including an access device formed on a storage device is described. The storage device has at least two stable states that may be used to store information. In operation, the access device is switched ON to allow a signal representing data to be coupled to the storage device. The storage device switches to a state representative of the signal and maintains this state after the access device is switched OFF. When the access device is switched ON, the state of the storage device may be sensed to read the data stored in the storage device. The memory cell may be formed to be unusually compact and has a reduced power supply requirements compared to conventional SRAM memory cells. As a result, a compact and robust SRAM having reduced standby power requirements is realized.

18 Claims, 8 Drawing Sheets

BASE CURRENT REVERSAL SRAM MEMORY CELL AND METHOD

CROSS-REFERENCE TO RELATED APPLICATIONS

This application is a divisional of pending U.S. patent application Ser. No. 10/284,984, filed Oct. 30, 2002, which is a continuation of U.S. patent application Ser. No. 09/757,683, filed Jan. 8, 2001, issued Dec. 3, 2002 as U.S. Pat. No. 6,489,192 B2, which is a divisional of U.S. patent application Ser. No. 09/268,823, filed Mar. 16, 1999, issued Nov. 6, 2001 as U.S. Pat. No. 6,313,490 B1.

TECHNICAL FIELD

The present invention relates in general to memory circuits and in particular to improved static random access memory cells.

BACKGROUND OF THE INVENTION

Random access memory ("RAM") cell densities have increased dramatically with each generation of new designs and have served as one of the principal technology drivers for ultra large scale integration ("ULSI") in integrated circuit ("IC") manufacturing. The area required for each memory cell in a memory array partially determines the capacity of a memory IC. This area is a function of the number of elements in each memory cell and the size of each of the elements. State-of-the-art memory cells for gigabit memory ICs using dynamic RAM ("DRAM") technology have cell areas approaching six minimum feature dimensions squared, or 6 $F^2$, where F represents a minimum feature size for photolithographically-defined features. Static RAM ("SRAM") densities, while increasing less dramatically than densities for DRAM technologies, have nevertheless also increased substantially.

A traditional six-device SRAM cell contains a pair of cross-coupled inverters, forming a latch circuit having two stable states. The minimum memory cell size attainable for this type of SRAM is approximately 120 $F^2$, as described in "CMOS Technology for 1.5V and Beyond," by Jack Y.-C. Sun, 1997 Int. Symp. on VLSI Tech., Syst. and Apps., Digest of Tech. Papers, pp. 293–297. Achieving further size reduction requires a new mechanism of memory cell operation.

Tunnel diodes have also been employed to provide negative differential resistance for SRAM cell operation. U.S. Pat. No. 5,390,145, entitled "Resonance Tunnel Diode Memory", issued to Nakasha et al., describes a memory cell using pairs of GaAs tunnel diodes coupled in series and providing memory cells having an area of about 30 $F^2$. "RTD-HFET Low Standby Power SRAM Gain Cell", IEEE E1. Dev. Lett., Vol. 19, No. 1 (January 1998), pp. 7–9, by J. P. A. van der Wagt et al. describes successful operation of memory cells using III–V semiconductor resonant tunnel diodes and separate read and write devices. However, GaAs devices are expensive to manufacture.

Base current reversal in bipolar transistors also can permit data storage. Base current reversal occurs when impact ionization occurring at a p-n junction between a base and a collector in the transistor results in minority carrier generation sufficient to cancel or exceed majority carrier injection from an emitter to the base. The base terminal then displays two or more stable states that do not source or sink current, and the transistor may be used to store information as represented by the state of the base terminal. FIG. 1 is a graph showing a simplified current-voltage characteristic for a storage device employing base current reversal, in accordance with the prior art.

As base voltage is increased from zero volts, base current is initially increased also, as shown in a first portion of a current-voltage characteristic 21 (to the left of a point marked "'B'"). A first stable state, at a point denoted "A," where no current passes through the base terminal corresponds to a base voltage of zero volts. As the base voltage increases, the number of electrons injected into the base and then diffusing into a depleted portion of the collector increases. These electrons are accelerated through the depleted portion of the collector. At the point marked "B" on the first portion 21 of the base-emitter current-voltage characteristic, holes created through impact ionization in the collector region and that are swept into the base begin to outnumber electrons injected from the emitter in forming a base terminal current $I_B$. As base-emitter voltage further increases, the number of holes created by impact ionization also increases (dashed portion of curve 21) until the net base terminal current $I_B$ becomes zero at the point marked "C" in FIG. 1, at a base emitter voltage of slightly less than 0.6 volts. This portion 21 of the current-voltage characteristic corresponds to a base current flowing in a direction normally associated with a base current for a NPN bipolar transistor.

A second portion 23 of the current-voltage characteristic corresponds to a base current flowing in the opposite of the direction illustrated in the first portion 21. The second portion 23 corresponds to holes being created by impact ionization at the collector-base junction of the transistor, where the holes collected by the base outnumber electrons emitted from the emitter and collected by the base. The base current becomes increasingly negative until the point marked "D" on the curve 23. At the point marked "D," electrons injected into the base from the emitter begin to dominate the base terminal current $I_B$, and the base terminal current $I_B$ again becomes very small (dashed trace).

The base terminal current $I_B$ again becomes zero at a point marked "E" in FIG. 1, corresponding to a base-emitter voltage of about 0.9 volts.

As base-emitter voltage is increased even further, a third portion 25 of the current-voltage characteristic corresponds to a base terminal current $I_B$ flowing in the same direction as the first portion 21. The base terminal current $I_B$ then behaves conventionally with further increases in base emitter voltage.

At the points "A," "C" and "E," the net base terminal current $I_B$ is zero. Significantly, the transistor is stable at these points. As a result, opening a switch coupled to the base results in the transistor staying at one of these points and allowing a state of the transistor to be determined by measuring the base-emitter voltage, (i.e., a "read" of the data stored in the transistor).

U.S. Pat. No. 5,594,683, entitled "SRAM Memory Cell Using A CMOS-Compatible High Gain Gated Lateral BJT", issued to M.-J. Chen and T. S. Huang, describes a memory employing base current reversal for data storage. FIG. 2 is a simplified schematic diagram of a generic memory cell 30 formed from a storage device 32 and an access element 34, in accordance with the prior art. The storage device 32 is represented as a NPN bipolar transistor in FIG. 2, however, the storage device 32 may be formed from a structure corresponding to a NMOS FET and may be capable of operating as either an NPN transistor or a NMOS FET, as described in "High-Gain Lateral Bipolar Action in a MOS-FET Structure" by S. Verdonckt-Vandebroek et al., IEEE Trans. El. Dev., Vol. 38, No. 11, November 1991, pp. 2487–2496.

The memory cell 30 is read by turning the access element 340N through application of a suitable signal to a word line driver 36. A sense amplifier (not shown in FIG. 2) is coupled to the storage device 32 through a bit line 38 and the access element 34.

Data can be written to the storage device 32 by applying a write pulse to a control electrode of a bit line switch 40 and also turning ON the access element 34 as described above. The data bit to be written to the storage device 32 is coupled through the bit line switch 40 to a control electrode of the storage device 32. The access element 34 is then turned OFF, electrically isolating the storage device 32 from the bitline 38 and storing the data bit in the memory cell 30. Compact memory cells 30 drawing as little as 1 nanoampere of standby current can be designed using this approach. However, the memory cell described in U.S. Pat. No. 5,594,683 requires an area of at least 8 $F^2$.

There is therefore a need for a compact and robust memory cell having reduced standby power draw requirements.

SUMMARY OF THE INVENTION

In one aspect, the present invention includes a memory cell. The memory cell is formed from semiconductor material and includes a vertical access element formed on a storage device. The storage device has a control electrode, a first current-carrying electrode coupled to a first reference voltage and a second current-carrying electrode coupled to a second reference voltage. The access element has a control electrode coupled to a first selection line, a first current-carrying electrode coupled to the control electrode of the storage device and a second current-carrying electrode coupled to a second selection line. The control electrode of the storage device can be set to one of several predetermined voltages by turning ON the access element and applying a signal to the control electrode of the storage device. Memory cells fabricated by forming the access element on the storage device allow very high density SRAMs to be manufactured.

In another aspect, the present invention includes a method of operating a memory device. The method includes coupling a first voltage to a control electrode of an access element that is part of a memory cell to turn the access element ON. The method also includes sensing a voltage at a control electrode of a storage device that is coupled to a first current-carrying electrode of the access element. The voltage represents data stored in the memory cell. The present invention further permits application of a voltage to the storage device control electrode to set the storage device to one of several stable states to store data in the memory cell. The method also permits coupling a second voltage to the access element control electrode to turn the access element OFF.

DETAILED DESCRIPTION OF THE INVENTION

Figure 1:
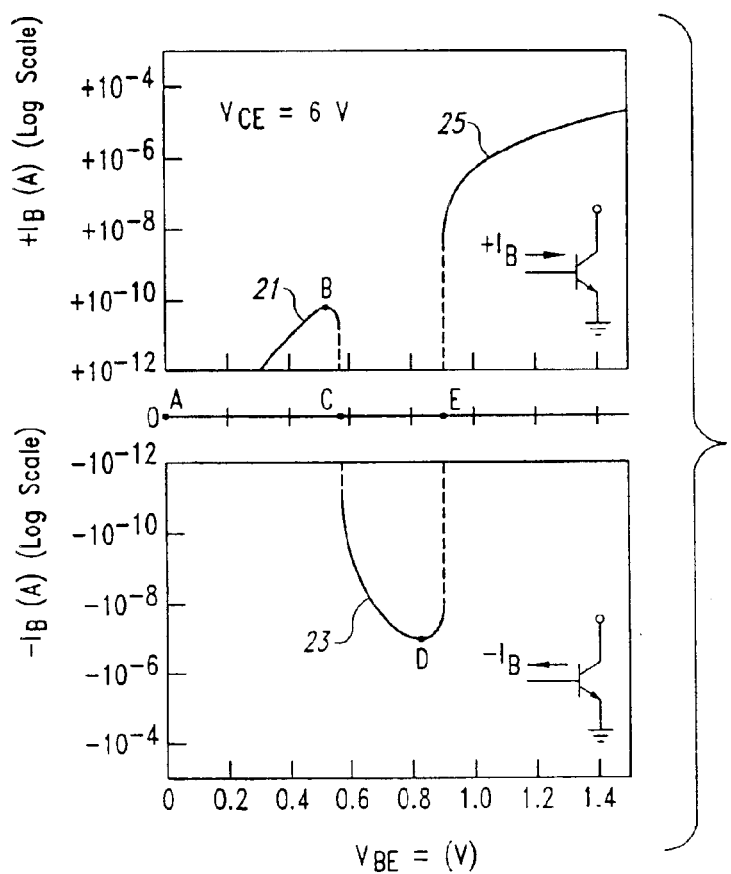
FIG. 1 is a graph showing a simplified current-voltage characteristic for a storage device, in accordance with the prior art.
Figure 2:
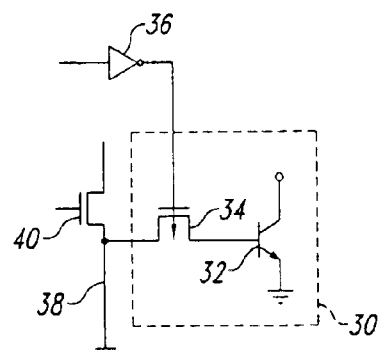
FIG. 2 is a simplified schematic diagram of a generic memory cell formed from a storage device and an access element, in accordance with the prior art.
Figure 3:
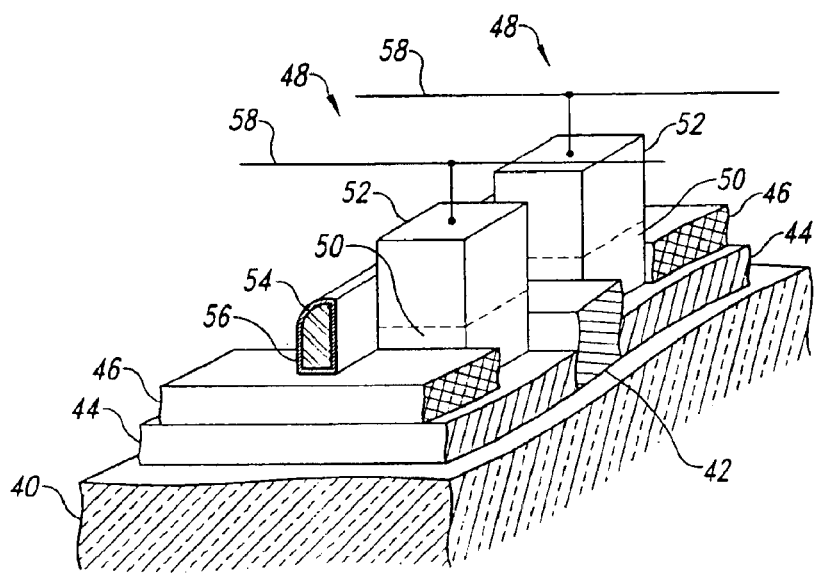
FIG. 3 is a simplified isometric view of an embodiment of the memory cell of FIG. 2, in accordance with an embodiment of the present invention.

FIG. 3 is a simplified isometric view of an embodiment of the generic memory cell 30 of FIG. 2, in accordance with an embodiment of the present invention. A substrate 40 has a contact stud 42 formed on it. In one embodiment, the substrate 40 is formed from n+-type semiconductor material such as silicon. In another embodiment, the substrate 40 is formed from p+-type semiconductor material. In either case, the contact stud 42 forms a low resistance contact to the substrate 40, which acts as a power supply return electrode.

A dielectric 44 is also formed on the substrate 40 and electrically isolates the substrate 40 from power supply busses 46 and from memory cells 48. Each of the memory cells 48 includes a storage device 50 and an access element 52 formed on the storage device 50. A word line 54 is capacitively coupled to the access elements 52 through a dielectric 56 surrounding the word line 54. The dielectric 56 also electrically isolates the word line 54 from the power supply busses 46.

Figure 4:
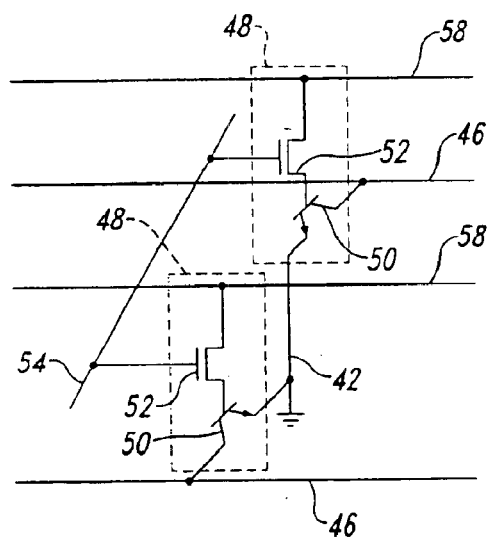
FIG. 4 is a simplified schematic diagram for the memory cell of FIG. 3, in accordance with an embodiment of the present invention.

FIG. 4 is a simplified schematic diagram for the memory cells 48 of FIG. 3, in accordance with an embodiment of the present invention. Many of the elements described in conjunction with the schematic diagram of FIG. 4 are identical to elements described in conjunction with in the embodiment illustrated in FIG. 3. Therefore, in the interest of brevity, these elements have been provided with the same reference numerals, and an explanation of them will not be repeated.

Data is coupled between the memory devices 50 and a selected bit line 58 by a signal coupled through one of the word lines 54 that turns a selected group of the access elements 52 on. In one embodiment, the access elements 52 are vertical PMOS FETs having gates formed by the word line 54 and the storage devices 50 are bipolar transistors formed in sources of the PMOS FETs forming the access elements 52.

Figure 5:
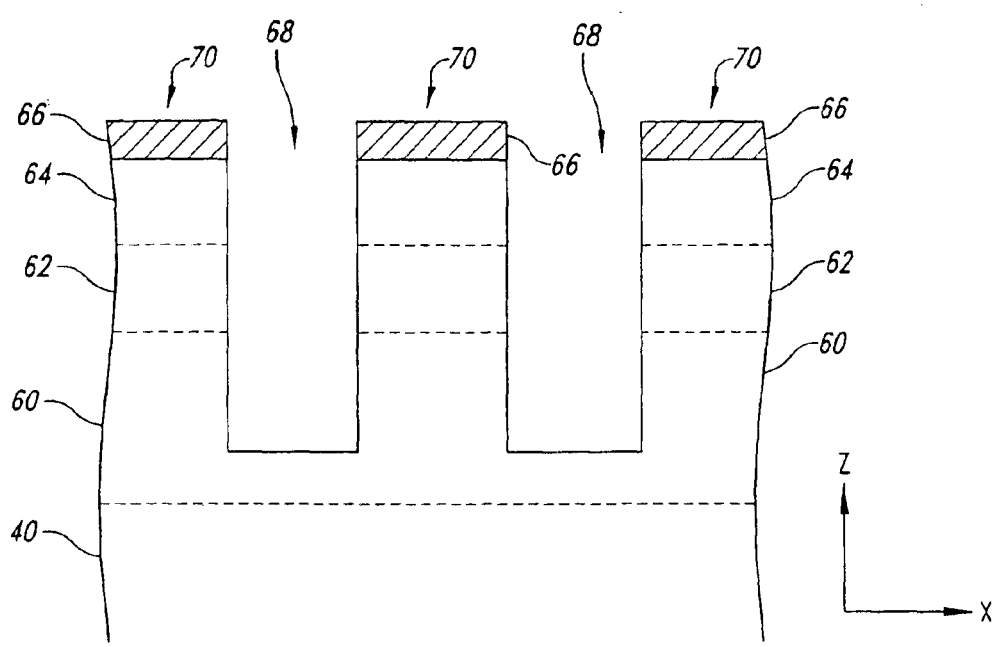
FIG. 5 is a simplified cross-sectional view of a semiconductor substrate that can be processed to form the memory cell of FIGS. 3 and 4, in accordance with an embodiment of the present invention.

FIG. 5 is a simplified cross-sectional view of a semiconductor substrate 40 that can be processed to form the memory cells 48 of FIGS. 3 and 4, in accordance with an embodiment of the present invention. Axes labeled "x" and "z" are also shown in FIG. 5 to clarify relationships between the various Figures.

In one embodiment, an epitaxial layer 60 is grown on the substrate 40. In one embodiment, the epitaxial layer 60 is a p-type epitaxial layer having a thickness of about 0.4 micron and an acceptor concentration NA of about $10^{17}$ per cubic centimeter. An epitaxial layer 62 is grown on the epitaxial layer 60. In one embodiment, the epitaxial layer 62 is a n-type epitaxial layer having a thickness of about 0.2 micron and a donor concentration ND of about $10^{17}$ per cubic centimeter. An epitaxial layer 64 is grown on the epitaxial layer 62. In one embodiment, the epitaxial layer 64 is a p+-type epitaxial layer having a thickness of about 0.2 micron and an acceptor concentration NA of about $102°$ per cubic centimeter.

A mask layer 66 is formed on the epitaxial layer 64. In one embodiment, the mask layer 66 is formed by conventional chemical vapor deposition ("CVD") of a silicon dioxide layer 10 nanometers thick followed by conventional CVD of a silicon nitride layer 100 nanometers thick. Conventional photolithography and etching are then used to define stripes in the masking layer 66. The stripes in the masking layer 66 have a width oriented in the "x" direction corresponding to the minimum photolithographic feature size F and a length that corresponds to a "y" direction, i.e., perpendicular to the sheet on which FIG. 5 is printed. The stripes in the mask layer 66 are then used as etch masks for an anisotropic etch to define trenches 68 extending through the epitaxial layers 64 and 62 and into the epitaxial layer 60, resulting in the structure shown in FIG. 5. The trenches 68 separate bars 70 of silicon material. In one embodiment, the trenches 68 are etched to a depth of 0.7 micrometers.

Figure 6:
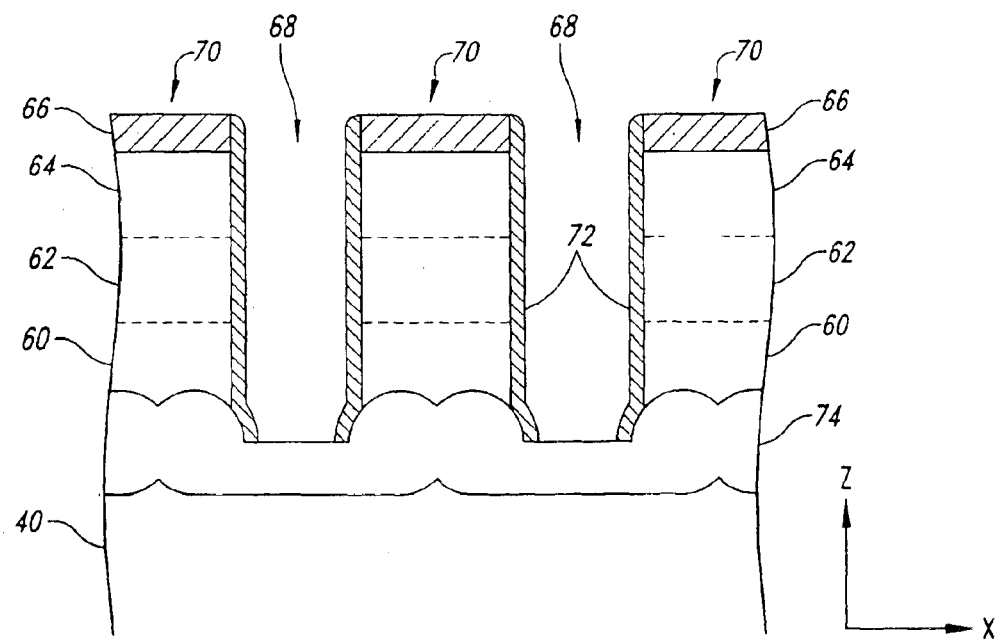
FIG. 6 is a simplified cross-sectional view of the substrate of FIG. 5 at a later point in processing, in accordance with an embodiment of the present invention.

FIG. 6 is a simplified cross-sectional view of the substrate 40 of FIG. 5 at a later point in processing, in accordance with an embodiment of the present invention. Following etching of the trenches 68, a thin protective layer 72 is formed over all exposed surfaces of the mask layer 66, sides of the bars 70 and bottoms of the trenches 68. In one embodiment, the thin protective layer 72 is formed by conventional CVD of silicon nitride to a thickness of 20 nanometers. A conventional timed anisotropic etch is then used to selectively remove the thin protective layer 72 from the bottoms of the trenches 68 and the tops of the bars 70. A conventional timed isotropic etch is then used to undercut the bars 70. The bars 70 of silicon are supported at their ends by portions that are not undercut (not illustrated). In one embodiment, the bars 70 are completely undercut. In another embodiment, the bars 70 are largely undercut. In either case, a conventional thermal oxidation is carried out to form a silicon dioxide layer 74 that supports the bars 70 and that electrically isolates the bars 70 from the substrate 40, resulting in the structure illustrated in FIG. 6.

Figure 7:
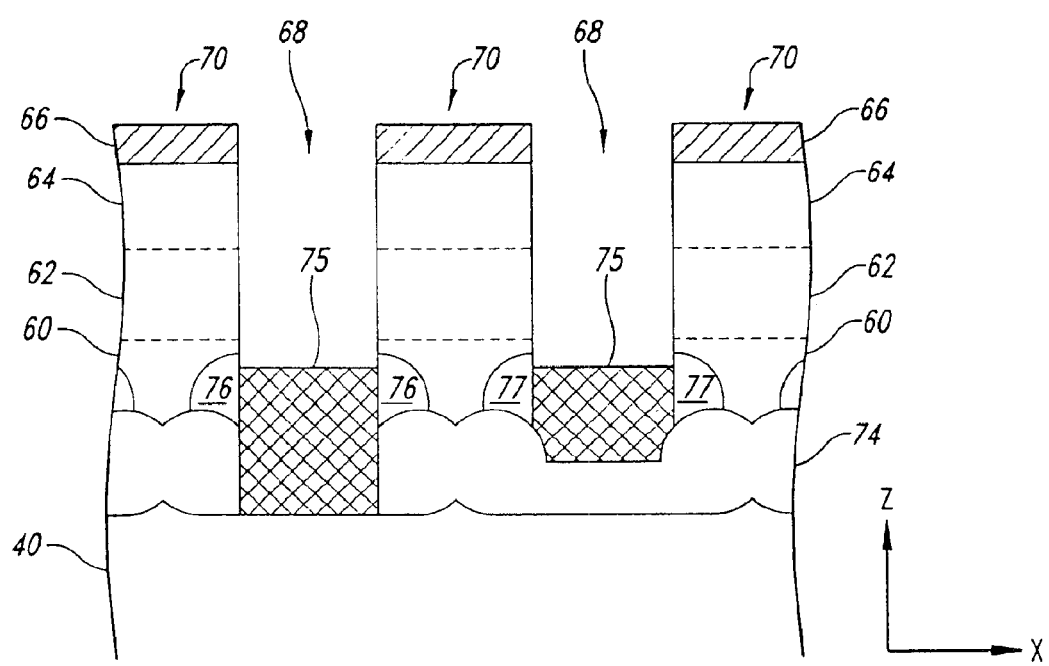
FIG. 7 is a simplified cross-sectional view of the substrate of FIG. 6 at a later point in processing, in accordance with an embodiment of the present invention.

FIG. 7 is a simplified cross-sectional view of the substrate 40 of FIG. 6 at a later point in processing, in accordance with an embodiment of the present invention. Conventional photolithography masks the bars 70 and alternate trenches 68. Conventional anisotropic etching removes the silicon dioxide layer 74 from the bottom of every other trench 68 to expose the substrate 40, although only two trenches 68 are shown in FIG. 7. Conventional timed isotropic etching strips the thin protective layer 72 from sidewalls of the trenches 68 and bars 70. Conventional CVD fills the trenches 68 with n+-type polycrystalline silicon 75, and conventional chemical-mechanical polishing planarizes the n+-type polycrystalline silicon 75, stopping on the mask layer 66.

Conventional timed reactive ion etching recesses a top surface of the n+-type polycrystalline silicon 75 to below a top of the epitaxial layer 60 and above a bottom of the epitaxial layer 60. The substrate 40 is heated to diffuse a portion of the n+-type donor atoms from the n+-type polycrystalline silicon 75 into the epitaxial layer 60 to form regions 76 and 77, resulting in the structure illustrated in FIG. 7. The regions 76 correspond to first current-carrying electrodes or emitters of the storage devices 50 of FIGS. 3 and 4, and the regions 77 correspond to second current-carrying electrodes or collectors of the storage devices 50.

Figure 8:
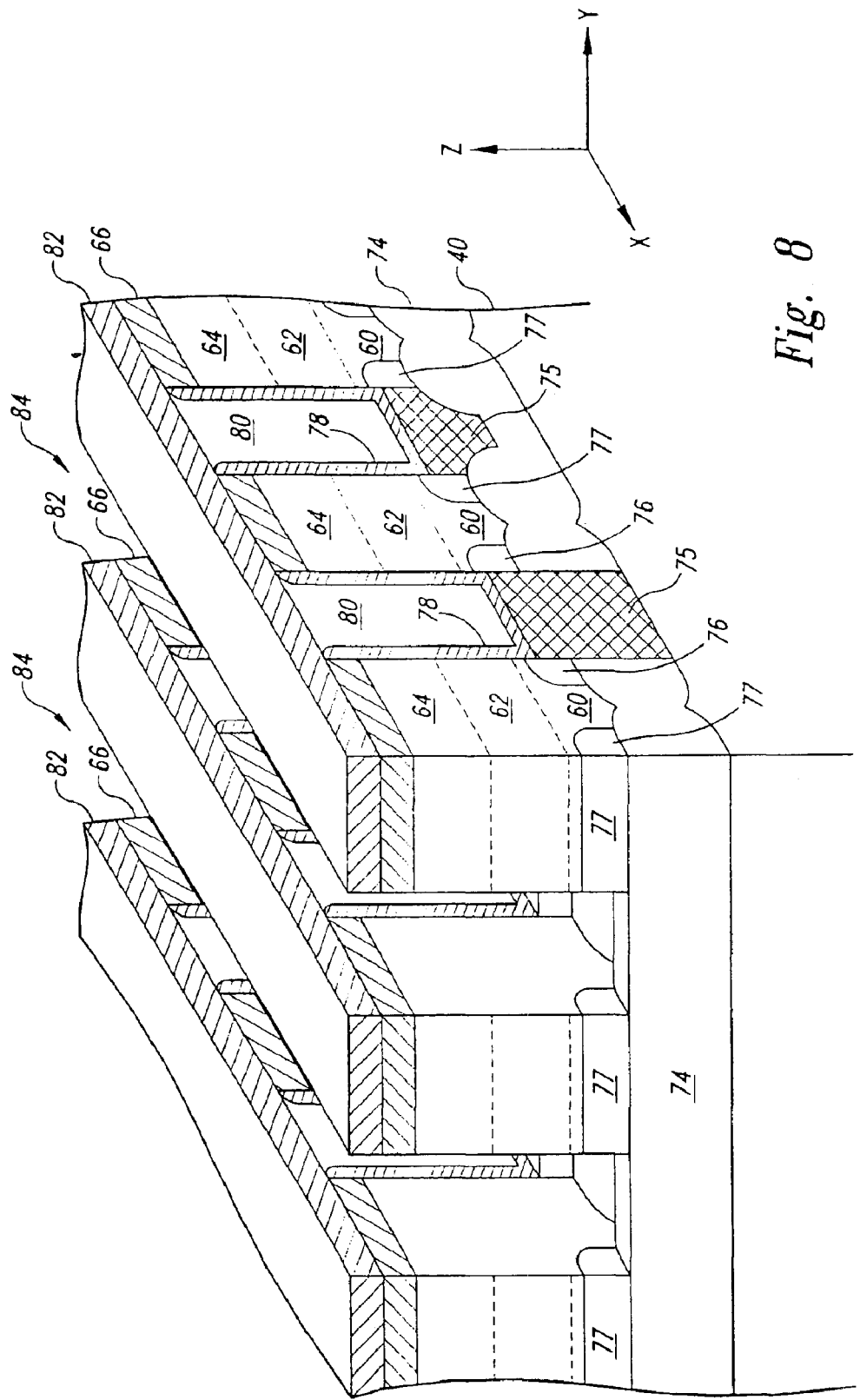
FIG. 8 is a simplified isometric cross-sectional view of the substrate of FIG. 7 at a later point in processing, in accordance with an embodiment of the present invention.

FIG. 8 is a simplified isometric cross-sectional view of the substrate 40 of FIG. 7 at a later point in processing, in accordance with an embodiment of the present invention. The structure shown in FIG. 8 is rotated relative to the structures illustrated in FIGS. 5 through 7 as indicated by "x," "y" and "z" axes shown in FIG. 8.

Another thin protective layer 78 is formed on the sides of the bars 70, the recessed surface of the n+-type polycrystalline silicon 75 and the mask layer 66. In one embodiment, the thin protective layer 78 is formed from silicon nitride having a thickness of 20 nanometers. Conventional CVD fills the trenches 68 and covers the bars 70 with a dielectric 80. In one embodiment, the dielectric 80 is formed from silicon dioxide formed by conventional TEOS that fills the trenches 68 and covers the bars 70. In one embodiment, conventional chemical-mechanical polishing planarizes the dielectric 80, removing the dielectric 80 from tops of the bars 70 and stopping on the mask layer 66. Another mask layer 82 is formed on the dielectric 80 and the mask layer 66. In one embodiment, the mask layer 82 is a silicon nitride layer formed by conventional CVD to have a thickness of 100 nanometers.

Conventional photolithography defines stripes of resist (not illustrated) at an angle to the stripes of FIGS. 5 through 7. In one embodiment, the mask layers 82 and 66 are etched to define stripes in the mask layer 82 having the minimum photolithographic feature size F along the "y" direction, ie., forming stripes at right angles to those of FIG. 5. Conventional anisotropic etching removes exposed portions the dielectric layer 80 from between the stripes of the mask layer 82, stopping on the thin protective layer 78.

A conventional selective anisotropic etch is used to etch exposed portions of the bars 70, which are formed from single crystal silicon, stopping at the silicon dioxide layer 74 and at exposed portions of the n+-type polycrystalline silicon 75. Exposed portions of the thin protective layer 78 are removed using conventional etching to provide trenches 84 in the structure shown in FIG. 8.

Figure 9:
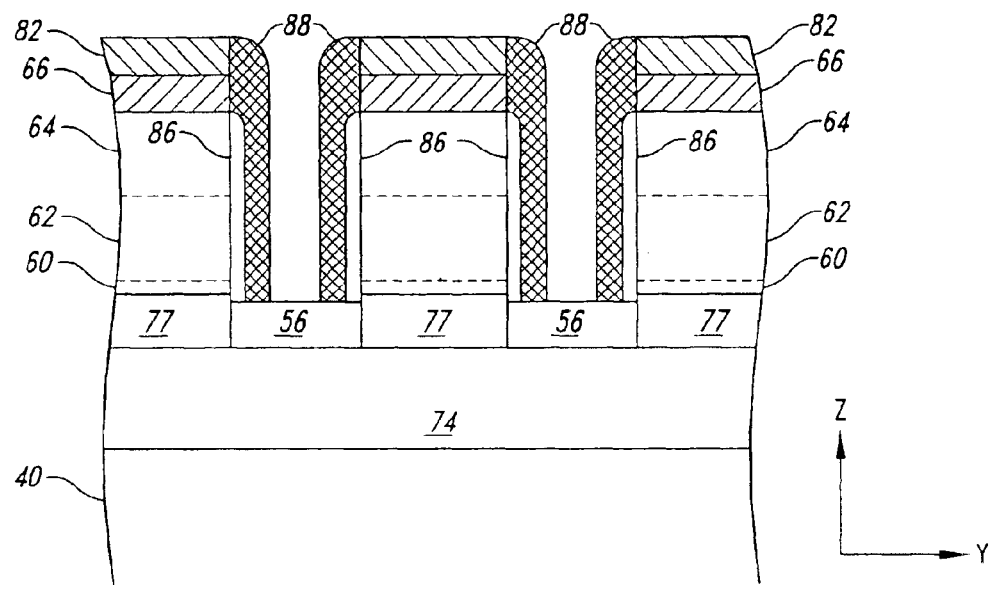
FIG. 9 is a simplified cross-sectional view of the substrate of FIG. 8 at a later point in processing, in accordance with an embodiment of the present invention.

FIG. 9 is a simplified cross-sectional view of the substrate 40 of FIG. 8 at a later point in processing, in accordance with an embodiment of the present invention. The dielectric 56 of FIG. 3 is formed on exposed portions of the n+-type polycrystalline silicon 75 (not shown in FIG. 9) and on exposed portions of the silicon dioxide layer 74. In one embodiment, the dielectric 56 is formed as a conventional CVD oxide that fills the trenches 84 and covers the mask layer 82. Conventional chemical-mechanical polishing may be used to planarize the dielectric 56 and to remove the dielectric 56 from the mask layer 82. A conventional timed etch may be used to recess a top surface of the dielectric 56 to a level below a junction between the epitaxial layers 60 and 62 without exposing tops of the n+-type polycrystalline silicon 75. A conventional thermal oxide 86 may be grown on exposed sides of the epitaxial layers 60, 62 and 64. In one embodiment, the oxide 86 is grown to a thickness of 10 nanometers.

P+-type polycrystalline silicon 88 is formed in the trenches 84 and on the mask layer 82 using conventional CVD. In one embodiment, the p+-type polycrystalline silicon 88 is formed to have a thickness of about ⅓ of the minimum photolithographic feature dimension F. A conventional anisotropic etch removes portions of the p+-type polycrystalline silicon 88 from bottoms of the trenches 84 and from tops of the mask layer 82, leaving p+-type polycrystalline silicon 88 on the thermal oxide 86 and providing the structure shown in FIG. 9.

Figure 10:
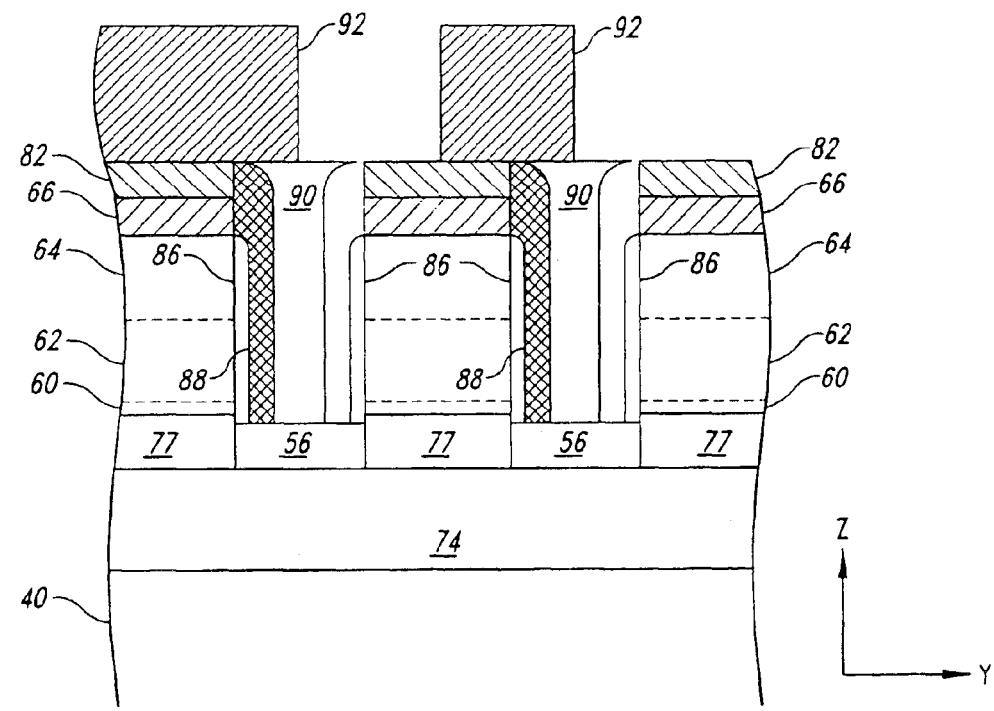
FIG. 10 is a simplified cross-sectional view of the substrate of FIG. 9 at a later point in processing, in accordance with an embodiment of the present invention.

FIG. 10 is a simplified cross-sectional view of the substrate 40 of FIG. 9 at a later point in processing, in accordance with an embodiment of the present invention. A dielectric 90 is deposited using conventional CVD to fill in spaces between portions of the p+-type polycrystalline silicon 88. The dielectric 90 is removed from the mask layer 82 and is planarized using conventional chemical-mechanical polishing. Photoresist 92 is conventionally applied and patterned to expose a top surface of the p+-type polycrystalline silicon 88 on one side, but not the other, of each of the trenches 84. A conventional isotropic etch then removes the p+-type polycrystalline silicon 88 from every other side of the trenches 84 to provide the structure shown in FIG. 10. The photoresist 92 and the mask layers 66 and 82 are conventionally stripped and conventional microfabrication is used to provide interconnections and other conventional structures.

The p+-type polycrystalline silicon 88 forms gates of the access elements 52 of FIGS. 3 and 4, and also forms the word lines 54. The access elements 52 include a drain formed by the epitaxial layer 64, a channel formed in the epitaxial layer 62 adjacent the p+-type polycrystalline silicon 88 and a source formed by the epitaxial layer 60. The oxide 86 forms a gate insulator separating the p+-type polycrystalline silicon 88 from the epitaxial layer 62. Stacking the access element 52 on top of the storage device 50 to provide the memory cells 48 of FIGS. 3 and 4 and forming the p+-type polycrystalline silicon 88 and the n+ type polycrystalline silicon 75 between memory cells 48 allows compact memory cells 48 having an area of four minimum photolithographic feature dimensions F squared to be formed.

Figure 11:
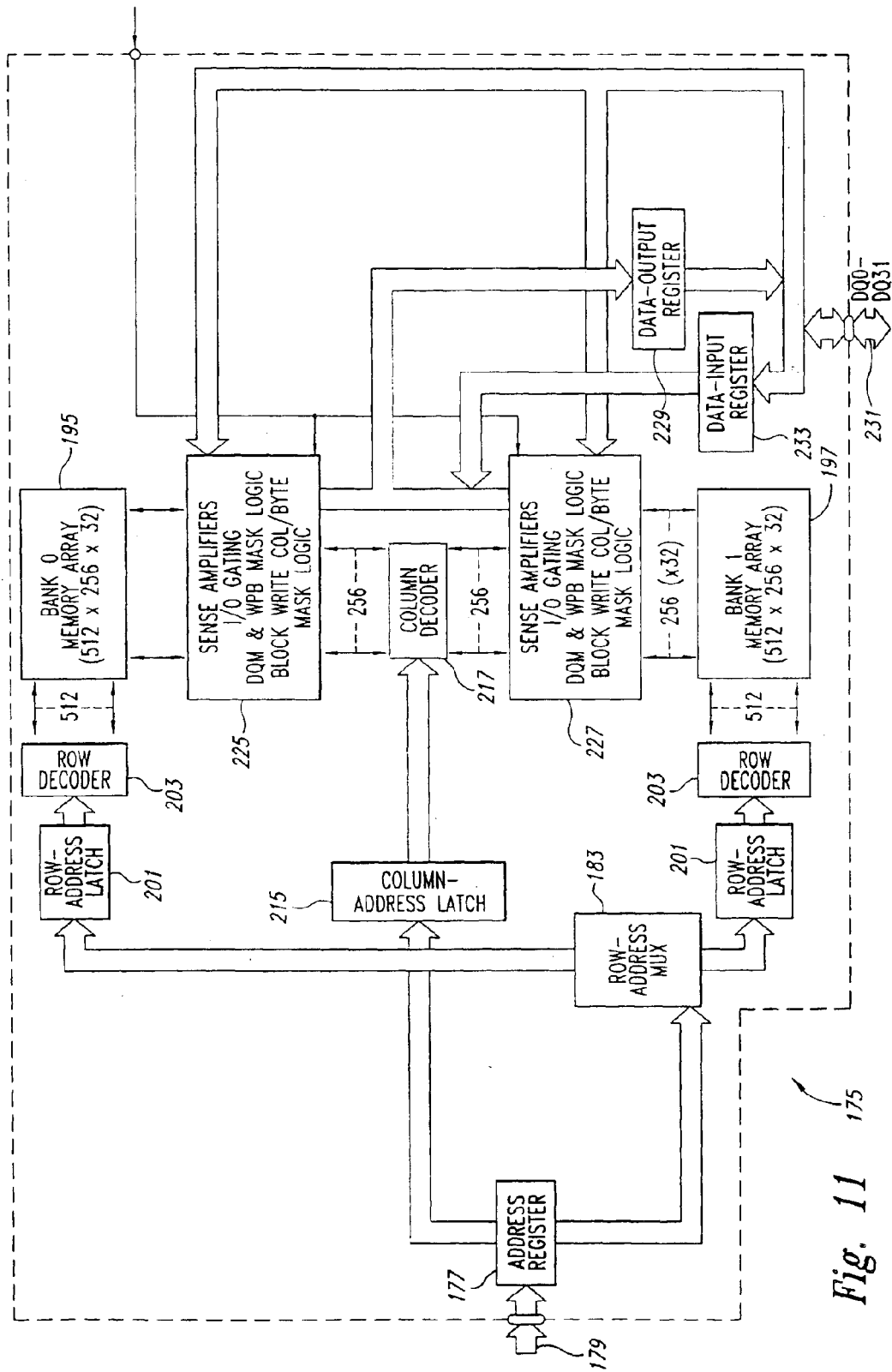
FIG. 11 is a simplified block diagram of an SRAM that can be formed using the memory cell of FIGS. 3 and 4, in accordance with an embodiment of the present invention.

FIG. 11 is a simplified block diagram of an SRAM 175 that can be formed using the memory cells 48 of FIGS. 3 and 4, in accordance with an embodiment of the present invention. The SRAM 175 includes an address register 177 that receives either a row address or a column address on an address bus 179. The address bus 179 is generally coupled to a memory controller (not shown in FIG. 11). Typically, a row address is initially received by the address register 177 and is applied to a row address multiplexer 183. The row address multiplexer 183 couples the row address to a number of components associated with either of two memory banks 195, 197 depending upon the state of a bank address bit forming part of the row address. Associated with each of the memory banks 195, 197 is a respective row address latch 201 which stores the row address, and a row decoder 203 which applies various signals to its respective memory bank 195 or 197 as a function of the stored row address. The row address multiplexer 183 also couples row addresses to the row address latches 201 for the purpose of refreshing memory cells in the memory banks 195, 197.

After the row address has been applied to the address register 177 and stored in one of the row address latches 201, a column address is applied to the address register 177. The address register 177 couples the column address to a column address latch 215. The column address from the column address latch 215 is decoded by a column address decoder 217 to address a specific column or columns. The row address corresponds to one or more of the word lines 54 of FIGS. 3 and 4, and the column address corresponds to one or more of the bit lines 58.

Data to be read from one of the memory banks 195, 197 is coupled to the column circuitry 225, 227 for one of the memory banks 195, 197, respectively. The data is then coupled to a data output register 229 which applies the data to a data bus 231. Data to be written to one of the memory banks 195, 197 is coupled from the data bus 231 through a data input register 233 to the column circuitry 225, 227 and then is transferred to one of the memory banks 195, 197, respectively.

Figure 12:
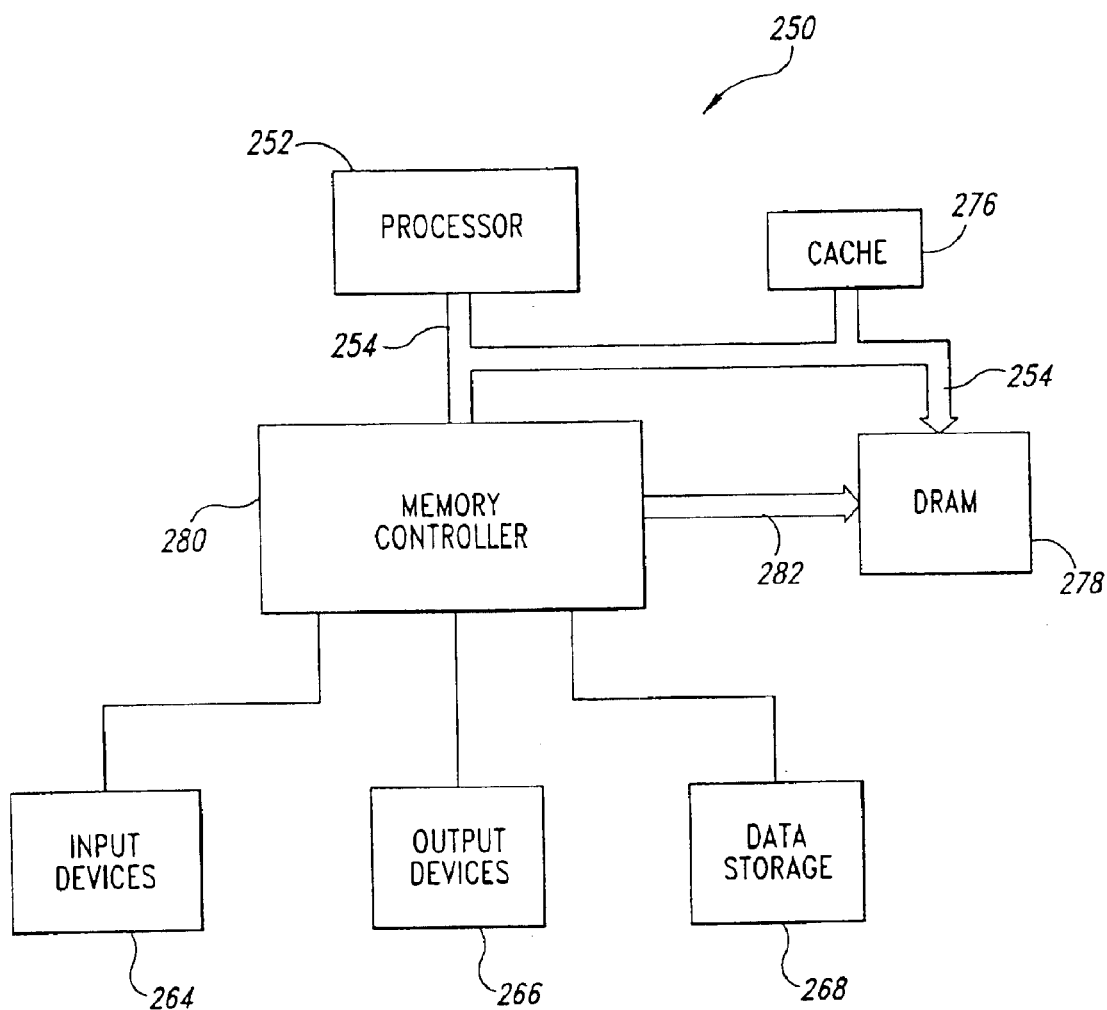
FIG. 12 is a simplified block diagram of a computer system including one or more memories using the SRAM FIG. 11, in accordance with an embodiment of the present invention.

FIG. 12 is a simplified block diagram of a computer system 250 including one or more memories using the SRAM 175 FIG. 11, in accordance with an embodiment of the present invention. The computer system 250 includes a processor 252 for performing various computing functions, such as executing specific software to perform specific calculations or tasks. The processor 252 includes a processor bus 254 that normally includes an address bus, a control bus and a data bus.

In addition, the computer system 250 includes one or more input devices 264, such as a keyboard or a mouse, coupled to the processor 252 to allow an operator to interface with the computer system 250. Typically, the computer system 250 also includes one or more output devices 266 coupled to the processor 252, such output devices typically being a printer or a video terminal. One or more data storage devices 268 are also typically coupled to the processor 252 to allow the processor 252 to store data or retrieve data from internal or external storage media (not shown). Examples of typical storage devices 268 include hard and floppy disks, tape cassettes and compact disk read-only memories (CD-ROMs).

The processor 252 is also typically coupled to cache memory 276, which is usually SRAM and may be the SRAM 175 of FIG. 11, by the processor bus 254, and to DRAM 278 through a memory controller 280. The memory controller 280 normally includes a control and address bus 282 that is coupled to the DRAM 278.

When incorporated into the computer system 250, the SRAM memory 175 of the present invention provides increased data density, high access speed and reduced power consumption. These advantages are particularly useful in the context of handheld or portable products.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory cell, comprising:
   a column of epitaxial layers having a first dimension along a first axis and a second dimension along a second axis perpendicular to the first axis;
   an oxide formed under the columns of epitaxial layers;
   a storage device formed in a lower layer of the epitaxial layers of the columns; and
   an access element formed on a surface of the column, the access element having a dimension in the first direction less than the first dimension of the column.

2. The memory cell of claim 1 wherein the storage device comprises a bipolar junction transistor.

3. The memory cell of claim 1 wherein the access element comprises a vertical p-channel MOS transistor.

4. The memory cell of claim 1 wherein the first dimension of the column corresponds to a feature size of the memory cell.

5. The memory cell of claim 1 wherein the dimension of the vertical access element in the first direction is less than half the first dimension of the column.

6. The memory cell of claim 1 wherein the storage device comprises a bipolar junction transistor and the access element comprises a vertical p-channel MOS transistor having a source formed in the same epitaxial layer in which the bipolar junction transistor is formed.

7. A memory cell, comprising:
   a column of epitaxial layers perpendicular to a substrate surface, the column having a lower epitaxial layer on which the other epitaxial layers are formed, the column further having a first dimension in a first direction and a second dimension in a second direction perpendicular to the first direction;
   a storage device formed in the lower epitaxial layer of the column; and
   a vertical access element formed on a surface of the column, the vertical access element having a dimension in the first direction less than the first dimension of the column.

8. The memory cell of claim 7 wherein the storage device comprises a bipolar junction transistor.

9. The memory cell of claim 7 wherein the vertical access element comprises a vertical p-channel MOS transistor.

10. The memory cell of claim 7 wherein the first dimension of the column corresponds to a feature size of the memory cell.

11. The memory cell of claim 7 wherein the dimension of the vertical access element in the first direction is less than half the first dimension of the column.

12. The memory cell of claim 7 wherein the storage device comprises a bipolar junction transistor and the vertical access element comprises a vertical p-channel MOS transistor having a source formed in the same epitaxial layer in which the bipolar junction transistor is formed.

13. An array of memory cells, comprising:
   a plurality of columns of epitaxial layers formed on a substrate surface, the columns of epitaxial layers having a first dimension along a first axis and second dimension along a second axis perpendicular to the first axis;
   a plurality of trenches separating the plurality of columns, each trench having a width in the direction of the first axis;
   a plurality of storage devices, each storage device formed in a lower layer of the epitaxial layers of the columns; and
   a plurality of access elements, each access element formed within a trench and on a surface of a respective column and having a dimension in the direction of the first axis that is less than the first dimension of the columns.

14. The array of memory cells of claim 13 wherein a first access element for a first memory cell and a second access element for a second memory cell are formed in the same trench.

15. The array of memory cells of claim 13 wherein each of the storage devices comprises a bipolar junction transistor.

16. The array of memory cells of claim 13 wherein each of the vertical access elements comprises a vertical p-channel MOS transistor.

17. The array of memory cells of claim 13 wherein the first dimension of each column corresponds to a feature size of the memory cells.

18. The array of memory cells of claim 13 wherein each of the storage devices comprises a bipolar junction transistor and each of the vertical access elements comprises a vertical p-channel MOS transistor having a source formed in the same epitaxial layer in which the bipolar junction transistor is formed.

* * * * *

UNITED STATES PATENT AND TRADEMARK OFFICE
CERTIFICATE OF CORRECTION

PATENT NO. : 6,891,213 B1
APPLICATION NO. : 10/626777
DATED : May 10, 2005
INVENTOR(S) : Wendell P. Noble It is certified that error appears in the above-identified patent and that said Letters Patent is hereby corrected as shown below:

| Column, Line | Reads | Should Read |
| --- | --- | --- |
| Item (56), Line 1 | "A SRAM memory cell" | --An SRAM memory cell-- |
| Item (56), Line 11 | "and has a reduced power" | --and has reduced power-- |
| Column 1, Line 42 | "for 1.5V" | --for 1.8V-- |
| Column 2, Lines 23 and 60 | "a NPN" | --an NPN-- |
| Column 2, Line 60 | "in FIG. 2, however," | --in FIG. 2; however,-- |
| Column 2, Lines 62 and 63 | "a NMOS" | --an NMOS-- |
| Column 3, Line 2 | "340 N" | --34 ON-- |
| Column 4, Line 25 | "SRAM" | --SRAM of-- |
| Column 4, Line 53 | "with in the" | --within the-- |
| Column 5, Line 8 | "concentration NA" | --concentration $N_A$-- |
| Column 5, Line 10 | "is a" | --is an-- |
| Column 5, Line 12 | "concentration ND" | --concentration $N_D$-- |
| Column 5, Line 16 | "concentration NA of about 102°" | --concentration $N_A$ of about $10^{20}$-- |
| Column 6, Line 40 | "exposed portions the" | --exposed portions of the-- |

UNITED STATES PATENT AND TRADEMARK OFFICE
CERTIFICATE OF CORRECTION

PATENT NO. : 6,891,213 B1
APPLICATION NO. : 10/626777
DATED : May 10, 2005
INVENTOR(S) : Wendell P. Noble It is certified that error appears in the above-identified patent and that said Letters Patent is hereby corrected as shown below:

| Column, Line | Reads | Should Read |
|---|---|---|
| Column 7, Line 38 | "n+ type" | --n+-type-- |
| Column 7, Line 41 | "F squared" | --$F^2$-- |
| Column 8, Line 17 | "SRAM 175 FIG. 11," | --SRAM 175 of FIG. 11,-- |

Signed and Sealed this

Thirteenth Day of March, 2007

JON W. DUDAS
*Director of the United States Patent and Trademark Office*